(12) United States Patent
Yeo et al.

(10) Patent No.: US 10,049,943 B2
(45) Date of Patent: Aug. 14, 2018

(54) METHODS OF MANUFACTURING A SEMICONDUCTOR DEVICE

(71) Applicant: SAMSUNG ELECTRONICS CO., LTD., Suwon-si, Gyeonggi-do (KR)

(72) Inventors: Jae-Hyun Yeo, Bucheon-si (KR); Jae-Suk Kwon, Seoul (KR); Kwang-Woo Lee, Hwaseong-si (KR); Eun-Seong Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/171,120

(22) Filed: Jun. 2, 2016

(65) Prior Publication Data

US 2017/0011967 A1 Jan. 12, 2017

(30) Foreign Application Priority Data

Jul. 10, 2015 (KR) ........................ 10-2015-0098234

(51) Int. Cl.
| | |
|---|---|
| *H01L 21/8238* | (2006.01) |
| *H01L 21/265* | (2006.01) |
| *H01L 21/324* | (2006.01) |
| *H01L 29/66* | (2006.01) |

(52) U.S. Cl.
CPC ........ *H01L 21/823814* (2013.01); *H01L 21/26513* (2013.01); *H01L 21/324* (2013.01); *H01L 21/823821* (2013.01); *H01L 21/823864* (2013.01); *H01L 21/823871* (2013.01); *H01L 29/66545* (2013.01); *H01L 29/66636* (2013.01)

(58) Field of Classification Search
CPC .......... H01L 21/823814; H01L 21/324; H01L 21/26513; H01L 21/823821
See application file for complete search history.

(56) References Cited

U.S. PATENT DOCUMENTS

| | | | | |
|---|---|---|---|---|
| 5,612,246 A | * | 3/1997 | Ahn ................. | H01L 21/76202 257/E21.552 |
| 6,156,598 A | * | 12/2000 | Zhou .................. | H01L 21/2652 257/E21.257 |
| 6,194,748 B1 | | 2/2001 | Yu | |
| 6,256,333 B1 | * | 7/2001 | Johnson ................ | B82Y 20/00 372/43.01 |

(Continued)

FOREIGN PATENT DOCUMENTS

KR 10-2005-0065150 A 6/2005

*Primary Examiner* — Kyoung Lee
*Assistant Examiner* — Christina Sylvia
(74) *Attorney, Agent, or Firm* — Lee & Morse, P.C.

(57) ABSTRACT

A method of manufacturing a semiconductor device includes forming a first gate structure on a substrate, the first gate structure including a gate insulation layer, a gate electrode, and a hard mask sequentially stacked on the substrate, forming a preliminary spacer layer on sidewalls of the first gate structure and the substrate, the preliminary spacer layer including silicon nitride, implanting molecular ions into the preliminary spacer layer to form a spacer layer having a dielectric constant lower than a dielectric constant of the preliminary spacer layer, anisotropically etching the spacer layer to form spacers on the sidewalls of the first gate structure, and forming impurity regions at upper portions of the substrate adjacent to the first gate structure.

19 Claims, 16 Drawing Sheets

(56) References Cited

U.S. PATENT DOCUMENTS

| | | |
|---|---|---|
| 6,753,232 B2 | 6/2004 | Kwak et al. |
| 6,902,971 B2 | 6/2005 | Grudowski |
| 7,723,220 B2 | 5/2010 | Park |
| 7,935,601 B1 * | 5/2011 | Neudeck ............ H01L 21/0465 438/186 |
| 8,426,266 B2 | 4/2013 | Hoentschel et al. |
| 9,385,124 B1 * | 7/2016 | Peng ............... H01L 21/823828 |
| 2003/0104702 A1 * | 6/2003 | Wu .................... H01L 21/0337 438/694 |
| 2007/0054505 A1 * | 3/2007 | Antonelli ............. C23C 16/402 438/789 |
| 2009/0020833 A1 | 1/2009 | Park |
| 2010/0081246 A1 | 4/2010 | Shin et al. |
| 2014/0367790 A1 * | 12/2014 | Choi ............... H01L 21/823443 257/369 |
| 2016/0035861 A1 * | 2/2016 | Park ................. H01L 29/66545 438/301 |
| 2017/0069547 A1 * | 3/2017 | Peng .............. H01L 21/823864 |

* cited by examiner

FISRST DIRECTION   SECOND DIRECTION

FISRST DIRECTION

SECOND DIRECTION

FISRST DIRECTION    SECOND DIRECTION

METHODS OF MANUFACTURING A SEMICONDUCTOR DEVICE

CROSS-REFERENCE TO RELATED APPLICATION

Korean Patent Application No. 10-2015-0098234, filed on Jul. 10, 2015, in the Korean Intellectual Property Office, and entitled: "Methods of Manufacturing A Semiconductor Device," is incorporated by reference herein in its entirety.

BACKGROUND

1. Field

Example embodiments relate to a method of manufacturing a semiconductor device. More particularly, example embodiments relate to a method of manufacturing a semiconductor device including a MOS transistor.

2. Description of the Related Art

A spacer may be formed on sidewalls of a gate structure in a MOS transistor. As a semiconductor device is highly integrated, a distance between gate structures may decrease.

SUMMARY

Example embodiments provide a method of manufacturing a semiconductor device having a low parasitic capacitance and good characteristics.

Example embodiments provide a semiconductor having a low parasitic capacitance and good characteristics.

According to example embodiments, there is provided a method of a semiconductor device. In the method, a first gate structure is formed on a substrate, and the first gate structure includes a gate insulation layer, a gate electrode and a hard mask sequentially stacked. A preliminary spacer layer is formed on sidewalls of the first gate structure and the substrate, and the preliminary spacer layer includes silicon nitride. Molecular ions are implanted into the preliminary spacer layer to form a spacer layer having a dielectric constant lower than a dielectric constant of the preliminary spacer layer. The spacer layer is anisotropically etched to form a spacer on the sidewalls of the first gate structure. Impurity regions are formed at upper portions of the substrate adjacent to the first gate structure.

In example embodiments, the molecular ions may include a compound of carbon and hydrogen or a compound of boron and hydrogen.

In example embodiments, each of the molecular ions may have a mass of about 20 AMU to about 1000 AMU, and a dose of the molecular ions may be about $5E13/cm^2$ to about $1E16/cm^2$.

In example embodiments, after implanting the molecular ions, the spacer layer may be further annealed.

In example embodiments, a doping depth of the molecular ions may be less than or substantially equal to a thickness of the preliminary spacer layer.

In example embodiments, an upper spacer may be further formed on the spacer.

In example embodiments, after forming the spacer, an insulating interlayer may be formed on the substrate to fill a space between the spacers. The first gate structure may be removed to form an opening. A second gate structure may be formed to fill the opening, the second gate structure including a gate insulation layer, a gate electrode and a hard mask, the gate electrode including a metal, the gate insulation layer covering sidewalls and a bottom of the gate electrode, and the hard mask being on the gate electrode and the gate insulation layer.

In example embodiments, the preliminary spacer layer may be formed by an atomic layer deposition (ALD) process or a chemical vapor deposition (CVD) process.

According to example embodiments, there is provided a method of a semiconductor device. In the method, a dummy gate structure is formed on a substrate. A preliminary spacer layer is formed on sidewalls of the dummy gate structure and the substrate, and the preliminary spacer layer includes silicon nitride. Molecular ions are implanted into the preliminary spacer layer to form a spacer layer having a dielectric constant lower than a dielectric constant of the preliminary spacer layer. The spacer layer is anisotropically etched to form a spacer on the sidewalls of the dummy gate structure. An upper portion of the substrate adjacent to the spacer layer is etched to form a recess. An epitaxial pattern including impurities is formed in the recess. The dummy gate structure is replaced with a gate structure including a gate insulation layer, a gate electrode and a hard mask sequentially stacked, and the gate electrode includes a metal.

In example embodiments, the molecular ions may include a compound of carbon and hydrogen or a compound of boron and hydrogen.

In example embodiments, after implanting the molecular ions, the spacer layer may be annealed.

In example embodiments, the preliminary spacer may have a thickness of about 10 Å to about 500 Å.

In example embodiments, an upper spacer may be further formed on the spacer.

In example embodiments, for replacing the dummy gate structure with the gate structure, an insulating interlayer may be formed on the substrate to fill a space between the spacers. The dummy gate structure may be removed to form an opening. The gate structure may be formed to fill the opening.

In example embodiments, before forming the dummy gate structure, upper portions of the substrate may be further etched to form an active fin protruding from a surface of the substrate.

According to example embodiments, there is provided a semiconductor device. The semiconductor device includes a gate structure on a substrate. A spacer is formed on sidewalls of the gate structure, and the spacer includes silicon nitride doped with at least one of boron molecules and carbon molecules. Impurity regions are formed at an upper portion of the substrate adjacent to the gate structure.

In example embodiments, the gate structure may include a gate insulation layer, a gate electrode and a hard mask sequentially stacked, and the gate electrode may include a metal.

In example embodiments, the spacer may have a thickness of about 10 Å to about 500 Å.

In example embodiments, an upper spacer may be on the spacer.

In example embodiments, an epitaxial pattern including impurities may be formed at the substrate adjacent to the spacer, and the impurity regions may be in the epitaxial pattern.

According to example embodiments, there is provided a method of manufacturing a semiconductor device, including forming a first gate structure on a substrate, the first gate structure including a gate insulation layer, a gate electrode, and a hard mask sequentially stacked on the substrate, conformally forming a preliminary spacer layer on sidewalls of the first gate structure and the substrate, the preliminary spacer layer including silicon nitride and having a predetermined thickness, implanting molecular ions into the preliminary spacer layer to a depth equal to or smaller than the predetermined thickness of the preliminary spacer layer, such that a spacer layer having a dielectric constant lower than a dielectric constant of the preliminary spacer layer is formed, anisotropically etching the spacer layer to form spacers on the sidewalls of the first gate structure, and forming impurity regions at upper portions of the substrate adjacent to the first gate structure.

In example embodiments, implanting the molecular ions may include forming a spacer layer including silicon carbonitride or silicon boron nitride.

In example embodiments, implanting the molecular ions may include selectively implanting the molecular ions only between top and bottom surfaces of the preliminary spacer layer.

In example embodiments, forming the preliminary spacer layer to have the predetermined thickness may include forming the preliminary spacer layer to a thickness of about of about 10 Å to about 500 Å.

In example embodiments, implanting the molecular ions may be performed with energy of about 0.1 KeV to about 50 KeV, each of the molecular ions having a mass of about 20 AMU to about 1000 AMU, and a dose of the molecular ions being about $5E13/cm^2$ to about $1E16/cm^2$.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
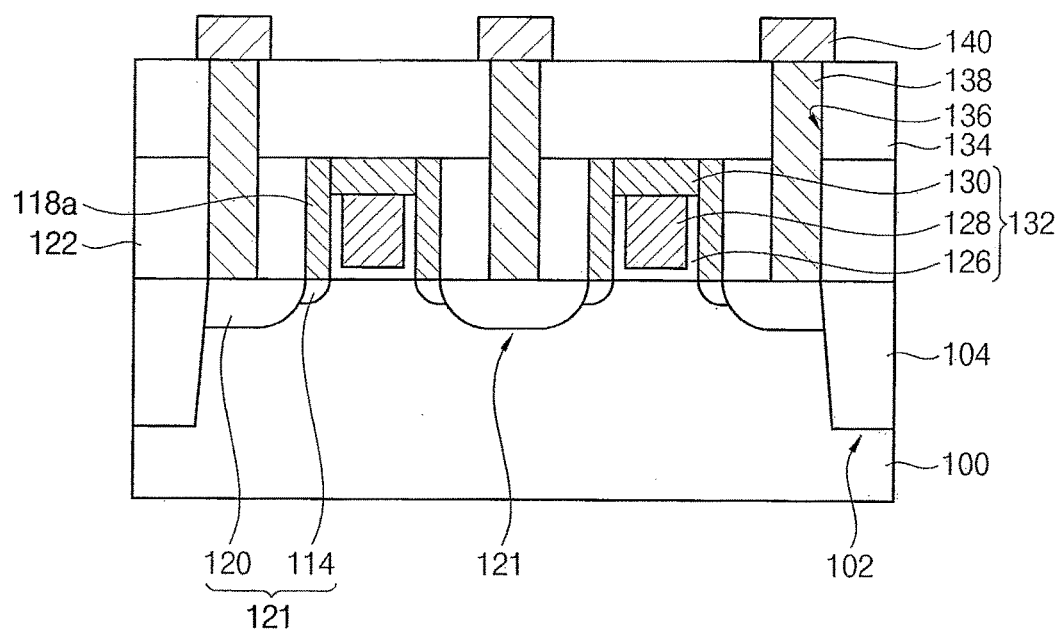
FIG. 1 illustrates a cross-sectional view of a semiconductor device in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on," "connected to," or "coupled to" another layer or substrate, it can be directly on, connected to, or coupled to the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device in accordance with an example embodiment.

Referring to FIG. 1, the semiconductor device may include a gate structure 132 including a gate insulation layer 126, a gate electrode 128, and a hard mask 130 sequentially stacked on a substrate 100. The substrate 100 may include a semiconductor material. A spacer 118a may be formed on sidewalls of the gate structure 132.

The substrate 100 may include an active region and an isolation region, which may be defined by an isolation layer 104 on the substrate 100. The isolation layer 104 may be formed in a trench 102 on the substrate 100. The isolation layer 104 may include an oxide, e.g., silicon oxide.

The gate insulation layer 126 may cover sidewalls and a bottom of the gate electrode 128. In example embodiments, the gate insulation layer 126 may include a metal oxide having a high dielectric constant, e.g., hafnium oxide, tantalum oxide, zirconium oxide, etc.

The gate electrode 128 may include a metal having a low electrical resistance, e.g., aluminum, copper, tantalum, etc., or a metal nitride thereof. The hard mask 130 may include a nitride, e.g., silicon nitride.

In example embodiments, an interface layer may be further formed between the substrate 100 and the gate structure 132. The interface layer may include an oxide, e.g., silicon oxide.

The spacer 118a may include silicon nitride doped with at least one of boron molecules and carbon molecules. Thus, the spacer 118a may have a dielectric constant lower than a dielectric constant of a spacer including silicon nitride only. In example embodiments, the spacer 118a may have a dielectric constant of about 4 to about 6. The spacer 118a may have a thickness of about 10 Å to about 500 Å.

In example embodiments, an offset spacer may be further formed between the gate structure 132 and the spacer 118a. The offset spacer may have a thickness less than a thickness of the spacer 118a. The offset spacer may include, e.g., silicon oxide.

Impurity regions 121 may be formed at an upper portion of the substrate 100 adjacent to the gate structure 132, and the impurity regions 121 may serve as source/drain regions. The impurity regions 121 may include a lightly doped region 114 and a highly doped region 120.

A first insulating interlayer 122 may be formed on the substrate 100 between spacers 118a of adjacent gate structures 132. A second insulating interlayer 134 may be formed on the first insulating interlayer 122 and the gate structure 132. A wiring structure may be electrically connected with each of the impurity regions 121. The wiring structure may include a contact plug 138 and a conductive pattern 140. The contact plug 138 may be formed through the first and second insulating interlayers 122 and 134, and may contact each of the impurity regions 121. The conductive pattern 140 may be formed on the contact plug 138.

In example embodiments, the contact plug 138 may be self-aligned with the spacer 118a, so that a sidewall of the contact plug 138 may contact the spacer 118a.

As described above, the semiconductor device may include the spacer 118a on the sidewalls of the gate structure 132, and the spacer 118a may have a dielectric constant lower than a dielectric constant of a spacer including only silicon nitride. Thus, a parasitic capacitance between adjacent gate structures 132 and a parasitic capacitance between gate structure 132 and adjacent respective contact plug 138s may decrease.

FIGS. 2 to 9 are cross-sectional views illustrating stages of a method of manufacturing a semiconductor device in accordance with example embodiment.

Figure 2:
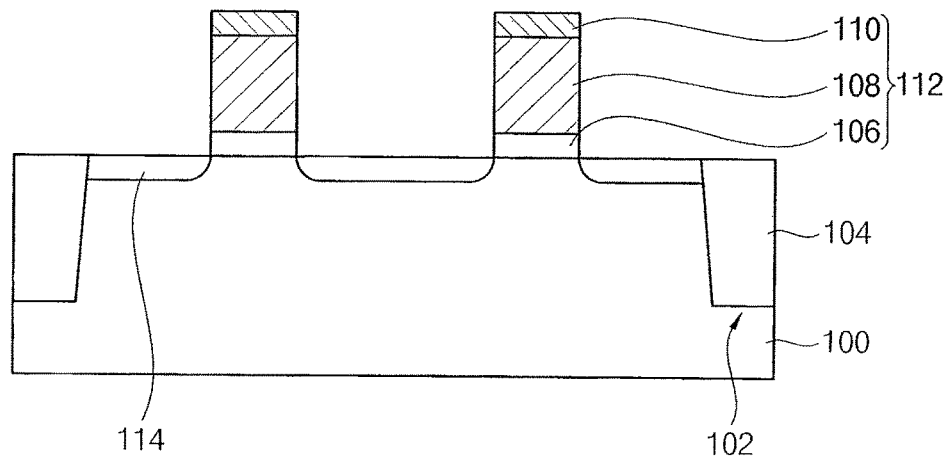
FIGS. 2 to 9 illustrate cross-sectional views of stages of a method of manufacturing a semiconductor device in accordance with an example embodiment.

Referring to FIG. 2, the isolation layer 104 may be formed on the substrate 100 by a shallow trench isolation (STI) process. A dummy gate structure 112 may be formed on the substrate 100. Also, a lightly doped region 114 may be formed at an upper portion of the substrate 100 adjacent to the dummy gate structure 112.

The substrate 100 may include a semiconductor material, e.g., silicon, germanium, silicon-germanium, etc., or a III-V group semiconductor compound, e.g., GaP, GaAs, GaSb, etc. In some embodiments, the substrate 100 may be a silicon-on-insulator (SOI) substrate, a germanium-on-insulator (GOI) substrate, etc.

The isolation layer 104 may be formed by etching an upper portion of the substrate 100 to form the trench 102, forming an insulation layer on the substrate 100 to fill the trench 102, and planarizing the insulation layer until the top surface of the substrate 100 is exposed.

The dummy gate structure 112 may be formed by sequentially forming a dummy gate insulation layer, a dummy gate electrode layer, and a gate mask layer on the substrate 100, patterning the gate mask layer by a photolithography process using a photoresist pattern to form a first hard mask 110, and sequentially etching the dummy gate electrode layer and the dummy gate insulation layer using the first hard mask 110 as an etching mask. Thus, the dummy gate structure 112 may include a dummy gate insulation pattern 106, a dummy gate electrode 108, and the first hard mask 110 sequentially stacked on the substrate 100.

The dummy gate insulation layer may be formed of an oxide, e.g., silicon oxide, the dummy gate electrode layer may be formed of, e.g., polysilicon, and the hard mask layer may be formed of a nitride, e.g., silicon nitride. The dummy gate insulation layer may be formed by, e.g., a chemical vapor deposition (CVD) process, an atomic layer deposition (ALD) process, etc. Alternatively, the dummy gate insulation layer may be formed by a thermal oxidation process. The dummy gate electrode layer and the hard mask layer may be formed by, e.g., a CVD process, an ALD process, etc.

Impurities may be lightly doped into an upper portion of the substrate 100 adjacent to the dummy gate structure 112, so that the lightly doped region 114 may be formed. The lightly doped region 114 may serve as source/drain regions of a MOS transistor. The lightly doped region 114 may be doped with n-type impurities or p-type impurities.

Figure 3:
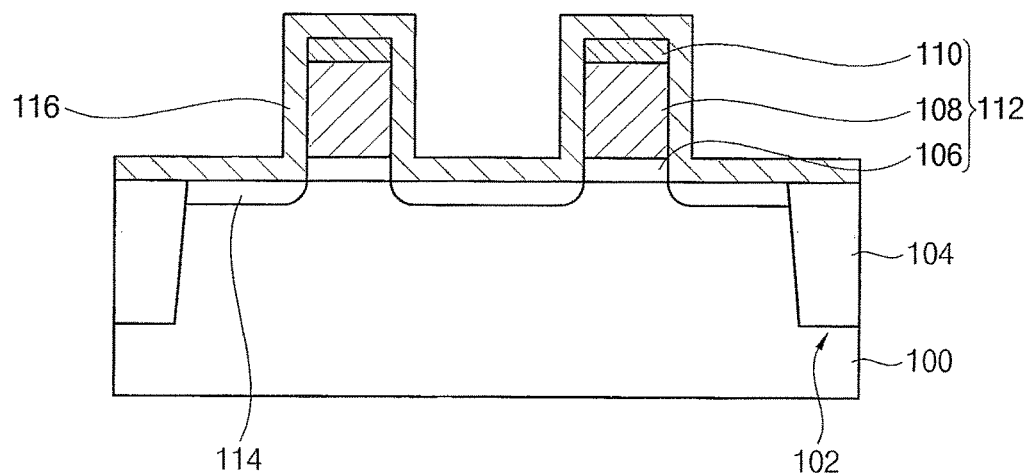

Referring to FIG. 3, a preliminary spacer layer 116 may be formed, e.g., conformally, on the dummy gate structure 112, the isolation layer 104, and the substrate 100. For example, the preliminary spacer layer 116 may have a substantially constant thickness as measured from a bottom surface of the preliminary spacer layer 116 to a top surface of the preliminary spacer layer 116 along a normal to the bottom surface.

In example embodiments, before forming the preliminary spacer layer 116, an offset spacer layer may be formed on the dummy gate structures 112, the isolation layer 104, and the substrate 100. The offset spacer layer may have a thickness less than a thickness of the preliminary spacer layer 116. The offset spacer layer may include, e.g., silicon oxide. The offset spacer layer may be formed by a CVD process, an ALD process, or a thermal oxidation process.

The preliminary spacer layer 116 may be formed of silicon nitride. When the preliminary spacer layer 116 has a thickness less than about 10 Å, a gate structure may not be sufficiently protected by a spacer subsequently formed from the preliminary spacer layer 106. When the preliminary spacer layer 116 has a thickness greater than about 500 Å, a parasitic capacitance may increase. Thus, the preliminary spacer layer 116 may be formed to have a thickness in a range of about 10 Å to about 500 Å. In example embodiments, the preliminary spacer layer 116 may be formed by, e.g., a CVD process or an ALD process. For example, the preliminary spacer layer 116 may be formed by an ALD process to have a thickness of about 10 Å to about 500 Å.

Figure 4:
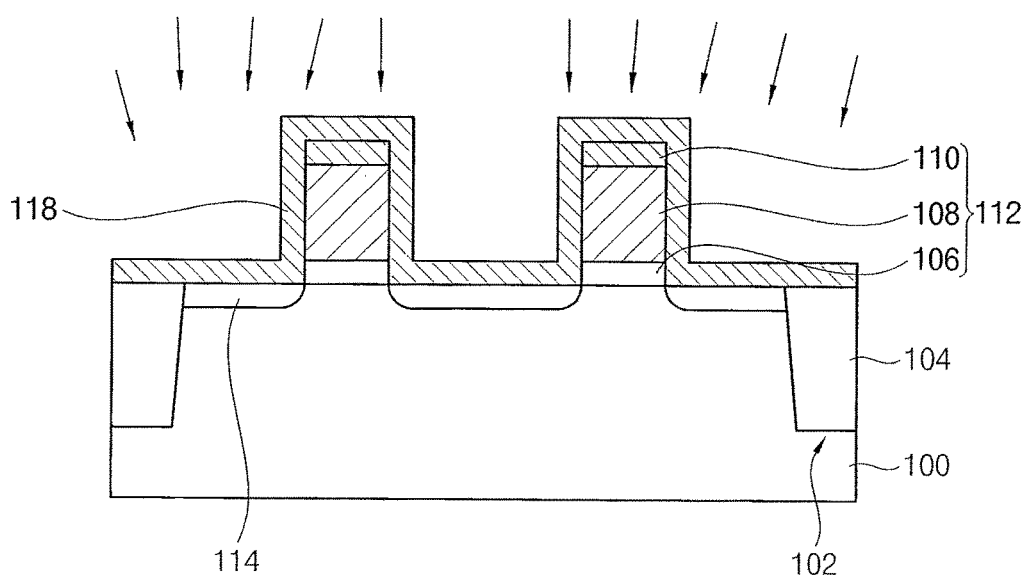

Referring to FIG. 4, at least one of boron molecular ions and carbon molecular ions may be implanted into the preliminary spacer layer 116 to form a spacer layer 118 including silicon nitride doped with boron molecular ions and/or carbon molecular ions. In example embodiments, a dielectric constant of the spacer layer 118 may be about 4 to about 6.

In the implantation process, most of the molecular ions may be doped into a surface of the preliminary spacer layer 116. In other words, the implantation process is adjusted to have most of the molecular ions doped within the preliminary spacer layer 16, i.e., between top and bottom surfaces of the preliminary spacer layer 16. Thus, the molecular ions may be doped only into the preliminary spacer layer 116, and may not be doped into the substrate 100 and the dummy gate structure 112. That is, a doping depth of the molecular ions, i.e., as measured from the top surface of the preliminary spacer layer 116, may be smaller than or substantially the same as the thickness of the preliminary spacer layer 116.

In example embodiments, the molecular ions may be implanted into the preliminary spacer layer 116 at an angle with respect to a top surface of the substrate 100, so that the molecular ions may be doped into the preliminary spacer layer 116 on a sidewall of the dummy gate structure 112. In example embodiments, the substrate 100 may be rotated while being tilted, and the molecular ions may be implanted into the substrate 100.

If atomic ions were to be implanted into the preliminary spacer layer 116, an impurity concentration at the top surface of the preliminary spacer layer 116 would have been lower than an impurity concentration at an inner portion of the preliminary spacer layer 116. Also, atomic ions may be implanted more deeply than molecular ions. Thus, atomic ions could not have been selectively implanted only into the preliminary spacer layer 116 having a thickness of about 10 Å to about 500 Å to form impurities therein.

In detail, molecular ion implantation may be performed with energy of about 0.1 KeV to about 50 KeV. The molecular ions may include a compound of carbon and hydrogen and/or a compound of boron and hydrogen. For example, each of the molecular ions may include a compound of carbon having several atoms to dozens of atoms and hydrogen. In another example, each of the molecular ions may include a compound of boron having several atoms to dozens of atoms and hydrogen. In example embodiments, each of the molecular ions may have a mass of about 20 AMU to about 1000 AMU. In example embodiments, a dose of the molecular ions may be about $5E13/cm^2$ to about $1E16/cm^2$.

After performing the molecular ion implantation, an annealing process may be preformed on the spacer layer 118. The annealing process may be performed at a temperature of about 300° C. to about 1500° C. during about 0.1 seconds to about 10 hours. In some example embodiments, the annealing process may not be performed.

The molecular ions may be diffused into an inner portion of the spacer layer 118 by the annealing process, so that the molecular ions may be uniformly doped into the spacer layer 118. The spacer layer 118 may include different materials according to the molecular ions implanted therein. That is, the spacer layer 118 may include one of silicon carbonitride (SiCN), silicon boron nitride (SiBN), and silicon boron carbonitride (SiBCN).

Figure 5:
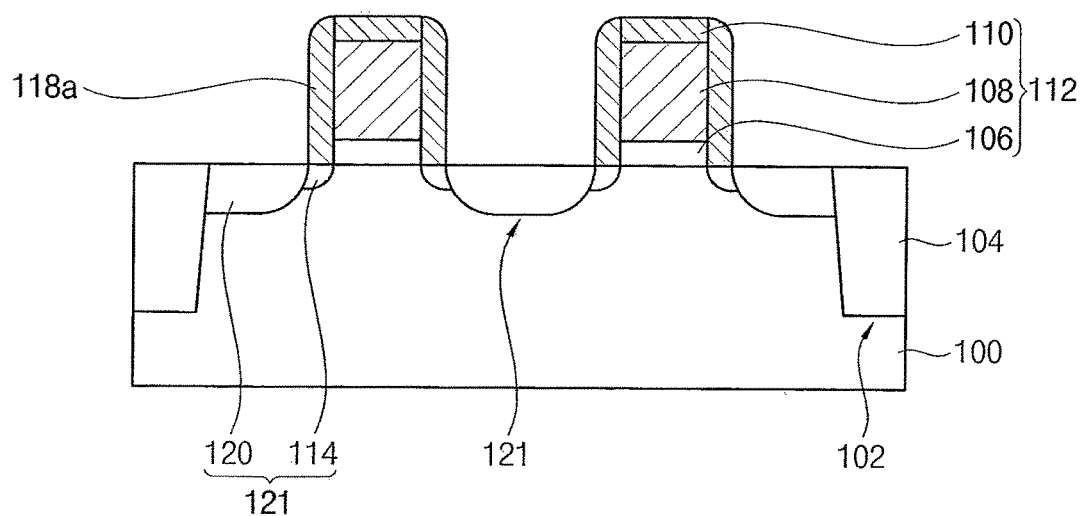

Referring to FIG. 5, the spacer layer 118 may be anisotropically etched to form spacers 118a on the sidewalls of the dummy gate structure 112. Further, impurities may be doped into an upper portion of the substrate 100 adjacent to the spacer 118a to form the highly doped region 120. The impurities may have a same conductivity type as the impurities in the lightly doped region 114. The highly doped region 120 and the lightly doped region 114 may form impurity regions 121, which may serve as source/drain regions of the MOS transistor.

Figure 6:
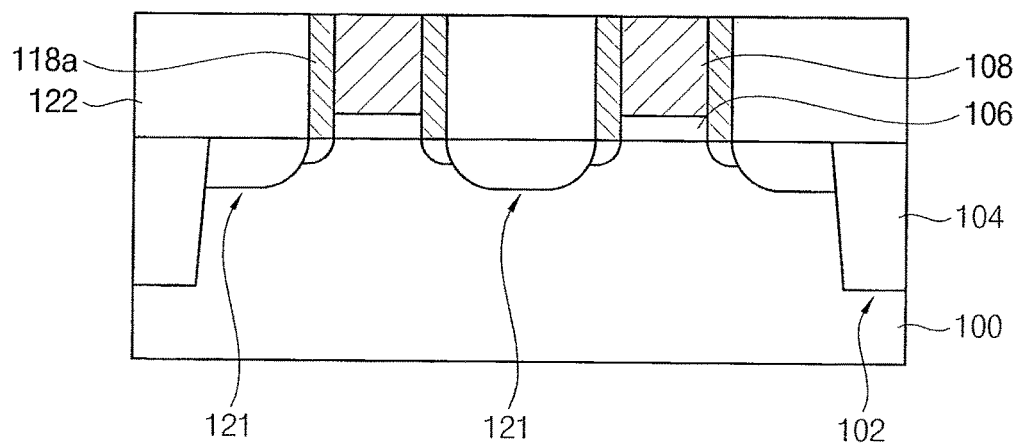

Referring to FIG. 6, the first insulating interlayer 122 covering the dummy gate structures 112, the spacer 118a, and the isolation layer 104 may be formed on the substrate 100, and an upper portion of the first insulating interlayer 122 may be planarized until top surfaces of the dummy gate structures 112 may be exposed. The first insulating interlayer 122 may include, e.g., silicon oxide. In example embodiments, the planarization process may be performed by a chemical mechanical polishing (CMP) process and/or an etch back process.

In example embodiments, the first hard mask 110 may be removed by the planarization process. In some example embodiments, the first hard mask 110 may partially remain on the dummy gate electrode 108.

Figure 7:
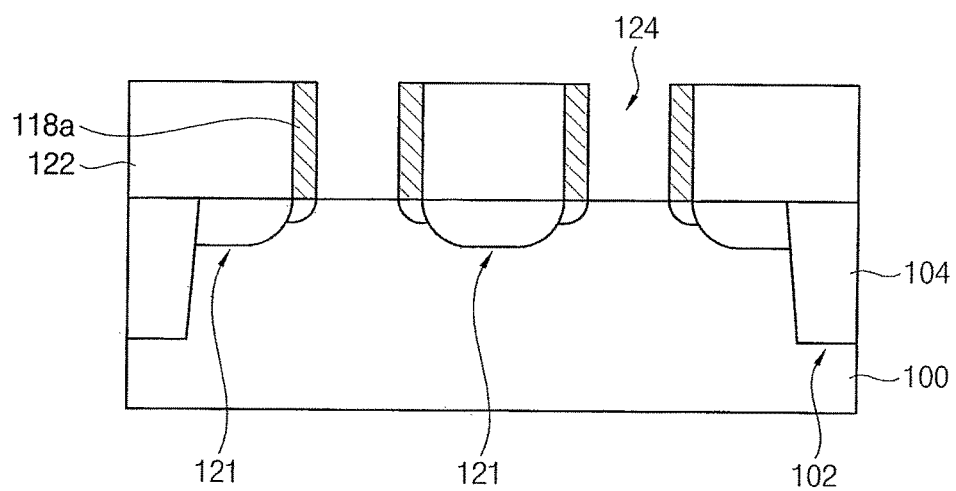

Referring to FIG. 7, the dummy gate electrode 108 and the dummy gate insulation pattern 106 may be isotropically etched to form an opening 124. A top surface of the substrate 100 may be exposed by the opening 124.

Figure 8:
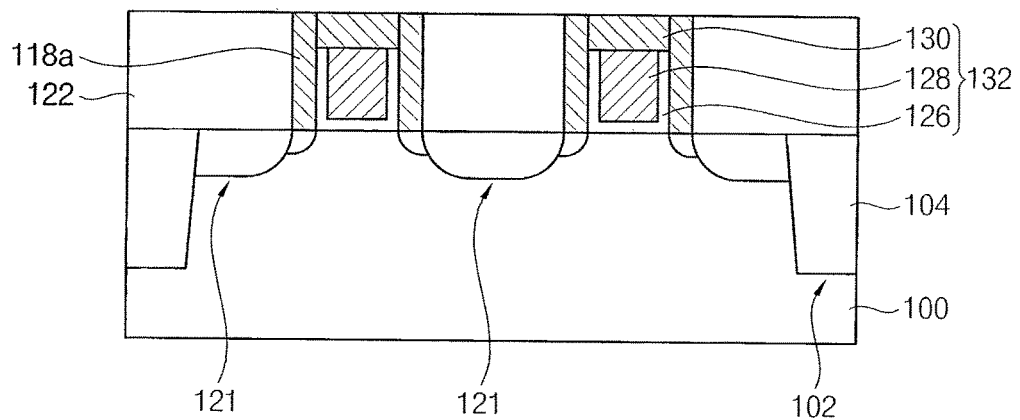

Referring to FIG. 8, the gate structure 132 may be formed to fill the opening 124. The gate structure 132 may include the gate insulation layer 126, the gate electrode 128, and the hard mask 130 sequentially stacked. An interface layer may be further formed between the substrate 100 and the gate insulation layer 126 in the opening 124. The interface layer may include silicon oxide formed by a thermal oxidation process.

In detail, a high-k dielectric layer may be formed on the exposed top surface of the substrate 100, a sidewall of the opening 124, and a top surface of the first insulating interlayer 122. A gate electrode layer may be formed on the high-k dielectric layer to fill a remaining portion of the opening 124.

The high-k dielectric layer may be formed of a metal oxide having a high dielectric constant, e.g., hafnium oxide, tantalum oxide, zirconium oxide, etc. The gate electrode layer may be formed of a material having a low resistance, e.g., a metal such as aluminum, copper, tantalum, etc., or a metal nitride thereof, by an ALD process, a physical vapor deposition (PVD) process, etc.

The gate electrode layer and the high-k dielectric layer may be planarized until the top surface of the first insulating interlayer 122 may be exposed. In example embodiments, the planarization process may be performed by a CMP process and/or an etch back process.

Upper portions of the gate electrode layer and the high-k dielectric layer may be etched. Thus, the gate insulation layer 126 may be formed on the exposed top surface of the substrate 100 and a lower sidewall of the opening 124, and the gate electrode 128 may be formed on the gate insulation layer 126 to fill a lower portion of the opening 124. A hard mask layer may be formed on the gate electrode 128 and the gate insulation layer 126 to fill a remaining portion of the opening 124, and the hard mask layer may be planarized until the top surface of the first insulating interlayer 122 may be exposed to form the hard mask 130.

Thus, the gate insulation layer 126, the gate electrode 128, and the hard mask 130 sequentially stacked may form the gate structure 132. The gate insulation layer 126 may cover sidewalls and a bottom of the gate electrode 128.

In some example embodiments, the dummy gate structure 112 may serve as a gate electrode structure. In this case, the gate replacement process illustrated with reference to FIG. 8 may not be performed.

Figure 9:
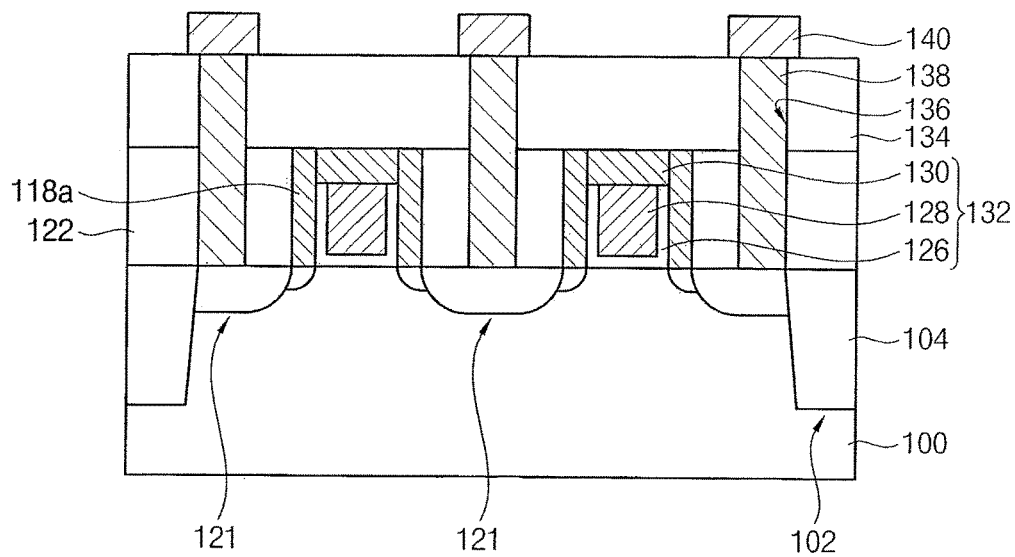

Referring to FIG. 9, the second insulating interlayer 134 may be formed on the first insulating interlayer 122 and the gate structure 132. In example embodiments, the second insulating interlayer 134 may include a material substantially the same as a material of the first insulating interlayer 122.

The first and second insulating interlayers 122 and 134 may be anisotropically etched to form the contact hole 136 exposing each of the impurity regions 121, and the contact plug 138 may be formed to fill the contact hole 136. The contact plug 138 may include a barrier pattern and a metal pattern. The conductive pattern 140 may be formed on the contact plug 138. The conductive pattern 140 may include, e.g., a pad electrode, a conductive line, etc.

As described above, the spacer 118a may be formed of silicon nitride doped with molecular ions, so that the spacer 118a may have a dielectric constant lower than a dielectric constant of a spacer including only silicon nitride. Thus, parasitic capacitance between adjacent gate structures 132, and parasitic capacitance between the gate structures 132 and respective adjacent contact plugs 138 may decrease.

Figure 10:
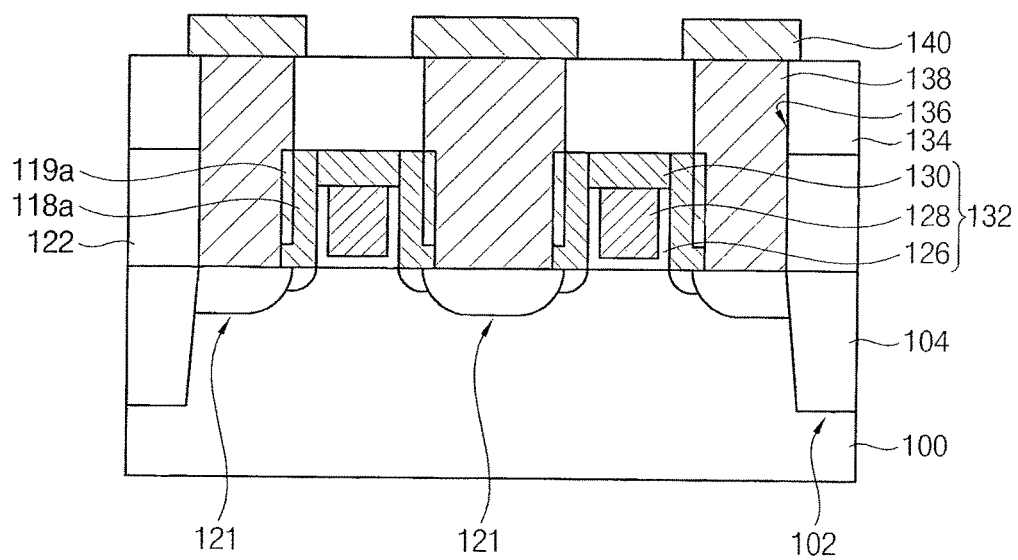
FIG. 10 illustrates a cross-sectional view of a semiconductor device in accordance with an example embodiment.

FIG. 10 is a cross-sectional view illustrating a semiconductor device in accordance with an example embodiment. The semiconductor device in FIG. 10 may be substantially the same as or similar to the semiconductor device of FIG. 1, except for the spacer and the contact plug.

Referring to FIG. 10, a spacer structure including the first spacer 118a and a second spacer 119a may be formed on sidewalls of the gate structure 132.

The first spacer 118a may be substantially the same as the spacer illustrated with reference to FIG. 1. That is, the first spacer 118a may include silicon nitride doped with at least one of boron molecules and carbon molecules. Thus, the spacer 118a may have a dielectric constant lower than a dielectric constant of a spacer including only silicon nitride.

The second spacer 119a may be formed on a sidewall of the first spacer 118a. The second spacer 119a may have a thickness less than a thickness of the first spacer 118a. In example embodiments, the second spacer 119a may have an etch rate lower than an etch rate of the first spacer 118a during an etching process for silicon oxide. That is, the second spacer 119a may have an etching selectivity with respect to silicon oxide higher than an etching selectivity of the first spacer 118a with respect to silicon oxide. In example embodiments, the second spacer 119a may include silicon nitride.

Impurity regions 121 may be formed at upper portions of the substrate 100 adjacent to the gate structure 132, and the impurity regions 121 may serve as source/drain regions.

A first insulating interlayer 122 may be formed on the substrate 100 between the second spacers 119a. A second insulating interlayer 134 may be formed on the first insulating interlayer 122 and the gate structure 132. A wiring structure may be electrically connected with the impurity regions 121. The wiring structure may include the contact plug 138 and the conductive pattern 140. The contact plug 138 may be formed through the first and second insulating interlayers 122 and 134, and may contact each of the impurity regions 121. The conductive pattern 140 may be formed on the contact plug 138.

In example embodiments, the contact plug 138 may be self-aligned with the second spacer 119a, so that a sidewall of the contact plug 138 may contact the second spacer 119a. As the second spacer 119a may have the etching selectivity with respect to silicon oxide higher than the etching selectivity of the first spacer 118a with respect to silicon oxide, damages of the spacer structure and the gate structure 132 may decrease during formation of the contact plug 138.

Figure 11:
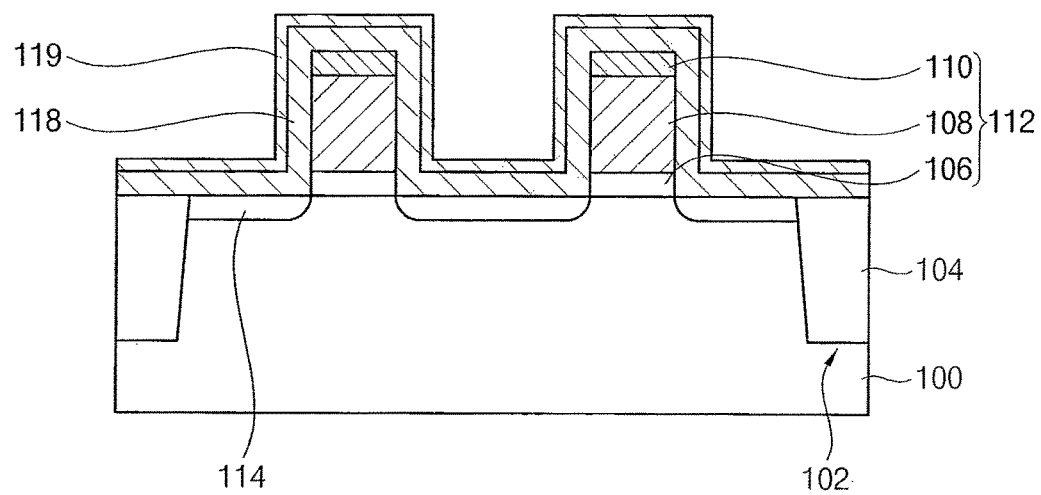
FIGS. 11 and 12 illustrate cross-sectional views of stages of a method of manufacturing a semiconductor device in accordance with an example embodiment.
Figure 12:
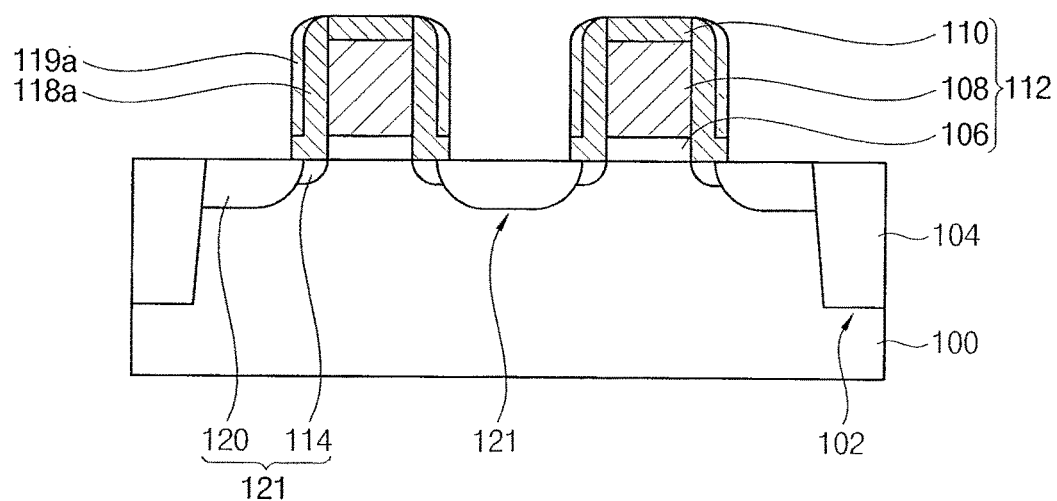

FIGS. 11 and 12 are cross-sectional views illustrating stages of a method of manufacturing a semiconductor device in accordance with example embodiment.

First, processes substantially the same as or similar to processes illustrated with reference to FIGS. 2 to 4 may be performed. Thus, the first spacer layer 118 may be formed on sidewalls of the dummy gate structure 112 and the substrate 100. The first spacer layer 118 may include silicon nitride doped with at least one of boron molecular ions and carbon molecular ions.

Referring to FIG. 11, a second spacer layer 119 may be formed on the first spacer layer 118. The second spacer layer 119 may be formed to have a thickness less than a thickness of the first spacer layer 118. The second spacer layer 119 may be formed by a CVD process or an ALD process. The second spacer layer 119 may have an etch rate lower than an etch rate of the first spacer layer 118 during an etching process for silicon oxide. That is, the second spacer layer 119 may have an etching selectivity with respect to silicon oxide higher than an etching selectivity of the first spacer layer 118 with respect to silicon oxide. In example embodiments, the second spacer 119 may be formed of, e.g., silicon nitride.

Referring to FIG. 12, the first and second spacer layers 118 and 119 may be anisotropically etched to form a spacer structure including the first spacer 118a and the second spacer 119 on the sidewalls of the dummy gate structure 112. Impurities may be doped into an upper portion of the substrate 100 adjacent to the spacer structure to form the highly doped region 120.

By performing a gate replacement process, the dummy gate structure 112 may be replaced with the gate structure 132. The gate replacement process may be substantially the same as or similar to processes illustrated with reference to FIGS. 6-8.

Referring to FIG. 10 again, the second insulating interlayer 134 may be formed on the first insulating interlayer 122 and the gate structure 132. The first and second insulating interlayers 122 and 133 may be anisotropically etched to form the contact hole 136 exposing each of the impurity regions 121. The contact plug 138 may be formed to fill the contact hole 136.

The contact hole 136 may be formed to be self-aligned with the spacer structure, so that a sidewall of the spacer structure may be exposed by the contact hole 136. The second spacer 119a exposed by the contact hole 136 may have the etching selectivity higher than an etching selectivity of the first spacer 118a during the etching process for silicon oxide. Thus, damages of the spacer structure and the gate structure 132 may decrease during formation of the contact hole 136. The conductive pattern 140 may be formed on the contact plug 138. The conductive pattern 140 may include, e.g., a pad electrode, a conductive line, etc.

Figure 13:
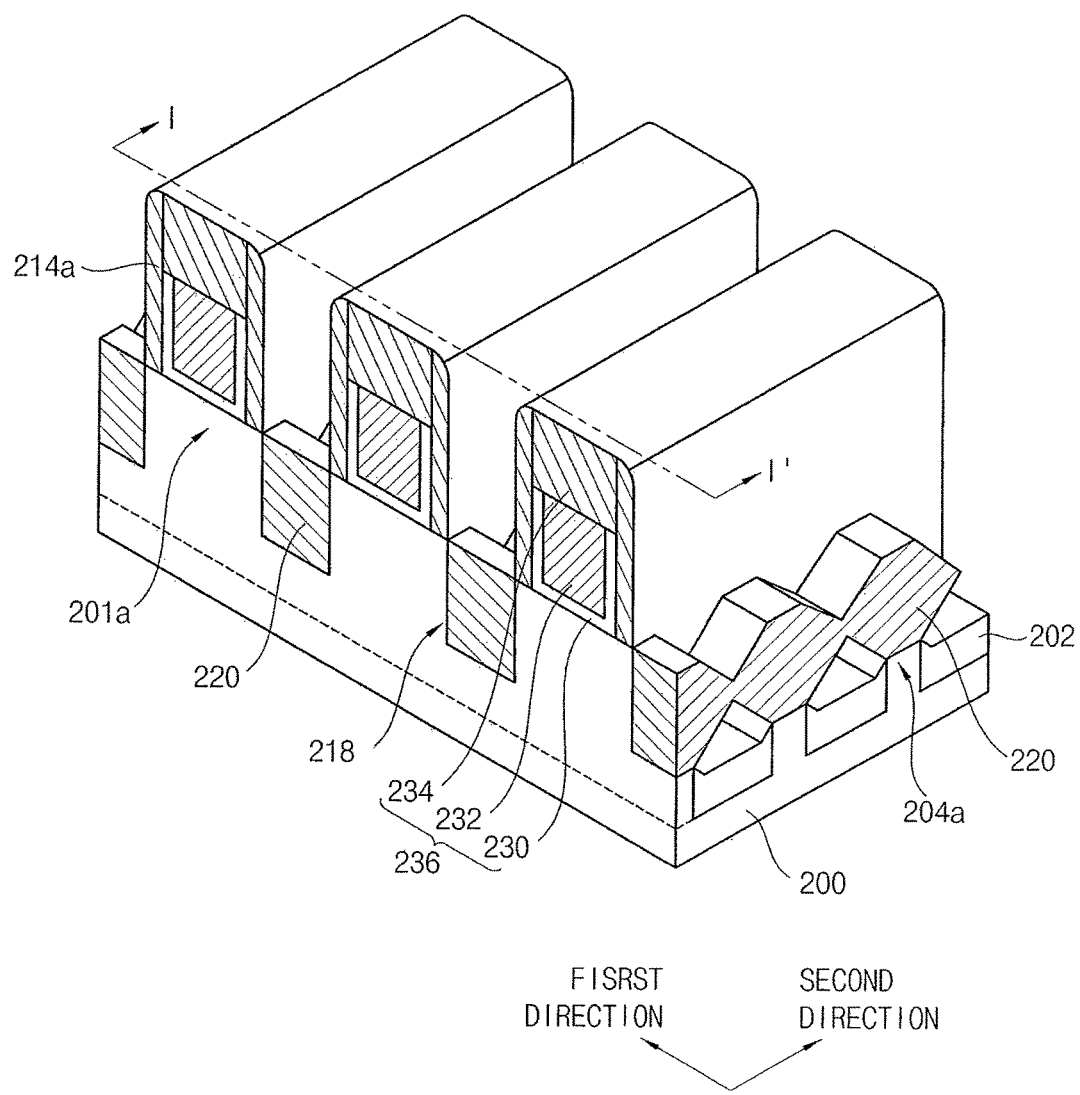
FIG. 13 illustrates a perspective view of a semiconductor device in accordance with an example embodiment.

FIG. 13 is a cross-sectional view illustrating a semiconductor device in accordance with an example embodiment.

Referring to FIG. 13, the semiconductor device may include a substrate 200, an active fin 201a, a gate structure 236, an epitaxial pattern 220, and a spacer 214. The semiconductor device may further include an isolation layer 202.

The substrate 200 may include a semiconductor material, e.g., silicon, germanium, silicon-germanium, etc., or a III-V group semiconductor compound, e.g., GaP, GaAs, GaSb, etc. In some embodiments, the substrate 200 may be a silicon-on-insulator (SOI) substrate, a germanium-on-insulator (GOI) substrate, etc.

The active fin 201a may include a first pattern extending in a first direction and a second pattern protruding upwardly from a top surface of the first pattern. The active fin 201a may include a material substantially the same as a material of the substrate 100. In example embodiments, a plurality of active fins 201a may be arranged in a second direction substantially perpendicular to the first direction.

A lower portion of the second pattern may be covered by the isolation layer 202, and an upper portion thereof may not be covered by the isolation layer 202. The upper portion of the second pattern may serve as an active region. A plurality of second patterns may be formed in the first direction, and a recess 218 may be formed between the second patterns in the first direction.

The isolation layer 202 may include an oxide, e.g., silicon oxide.

The gate structure 236 may extend in the second direction, and cover a top surface and a sidewall of the active fin 201a, and a plurality of gate structures 236 may be arranged in the first direction.

In example embodiments, the gate structure 236 may include a gate insulation layer 230, a gate electrode 232, and a hard mask 234 sequentially stacked on the active fin 201a, and the isolation layer 202.

The gate electrode 232 may include a material having a low resistance, e.g., a metal such as aluminum, copper, tantalum, etc., or a metal nitride thereof.

The gate insulation layer 230 may include a metal oxide having a high dielectric constant, e.g., hafnium oxide, tantalum oxide, zirconium oxide, etc. In example, the gate insulation layer 230 may cover sidewalls and a bottom of the gate electrode 232.

The hard mask 234 may include a nitride, e.g., silicon nitride.

In example embodiments, an interface pattern may be further formed between the active fin 201a and the gate structure 236. The interface pattern may include an oxide, e.g., silicon oxide.

The spacer 214a may be formed on sidewalls of the gate structure 236. The spacer 214a may cover the sidewalls of the gate structure 236. The spacer 214a may be substantially the same as the spacer illustrated with reference to FIG. 1.

In detail, the spacer 214a may include silicon nitride doped with at least one of boron molecules and carbon molecules. Thus, the spacer 214a may have a dielectric constant lower than a dielectric constant of a spacer including only silicon nitride. In example embodiments, the spacer 214a may have a dielectric constant of about 4 to about 6. The spacer 214a may have a thickness of about 10 Å to about 500 Å.

In example embodiments, an offset spacer may be further formed between the gate structure 236 and the spacer 214a.

The offset spacer may have a thickness less than a thickness of the spacer 214a. The offset spacer may include, e.g., silicon oxide.

The gate structure 236 and the spacer 214a may be formed on the second pattern of the active fin 201a. Also, the recess 218 may be formed between the spacers 214a.

The epitaxial pattern 220 may be formed in the recess 218. The epitaxial pattern 220 may protrude from the portion of the active fin 201a in the recess 218 and extend in the second direction. In example embodiments, the epitaxial pattern 220 may have a cross-section, e.g., along a plane defined by the second direction and a normal thereto, of any convenient shape, e.g., pentagon, hexagon, or rhombus.

In example embodiments, a plurality of epitaxial patterns 220 adjacent to each other in the second direction may be connected to each other to be merged into a single layer pattern. The epitaxial pattern 220 may be doped with impurities, and may serve as source/drain regions of a FinFET.

In example embodiments, the epitaxial pattern 220 may include silicon or silicon-germanium. A metal silicide pattern may be further formed on the epitaxial pattern 220.

A first insulating interlayer may be formed on the substrate 200 between the gate structures 236. A second insulating interlayer may be formed on the first insulating interlayer and the gate structure 236. A wiring structure may be formed through the first and second insulating interlayers, and may be electrically connected with the source/drain regions of the epitaxial pattern 220. The wiring structure may include a contact plug. The contact plug may be self-aligned with the spacer 214a, so that a sidewall of the contact plug may contact the spacer 214a.

Figure 15:
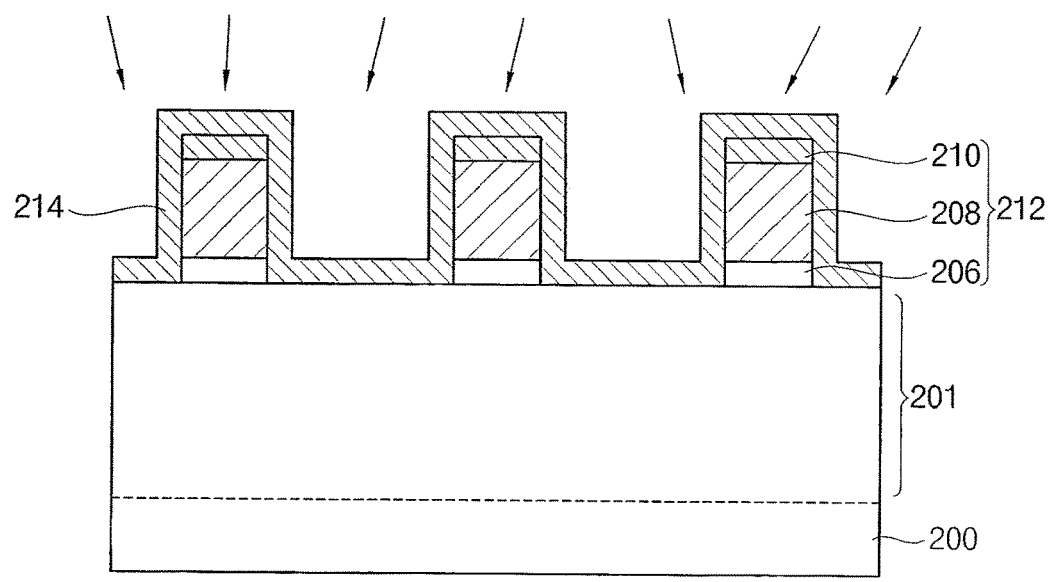
Figure 16:
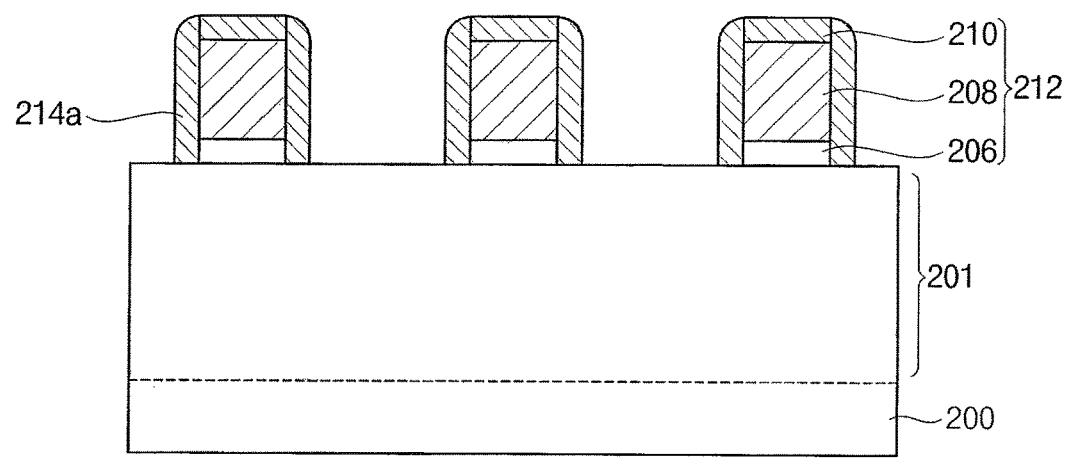
Figure 17:
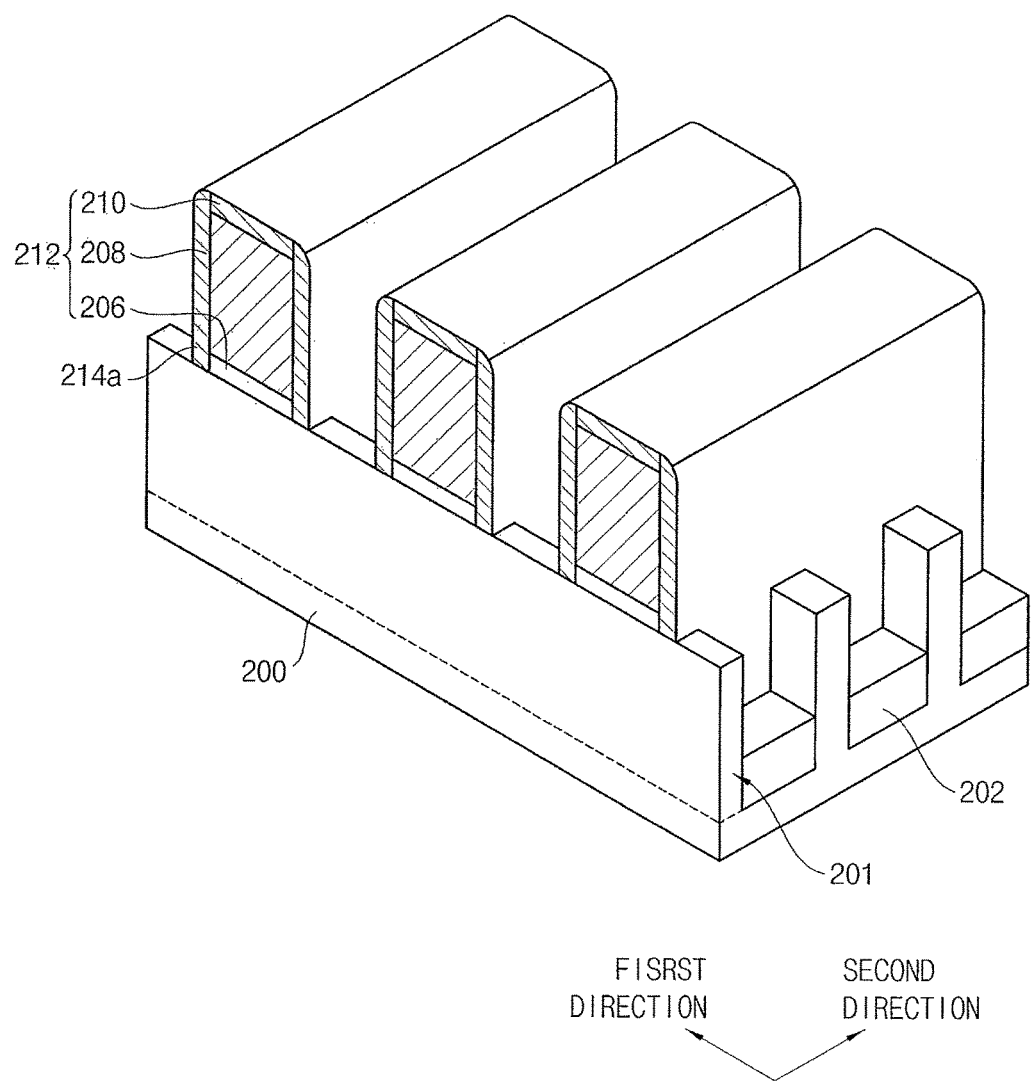
Figure 18:
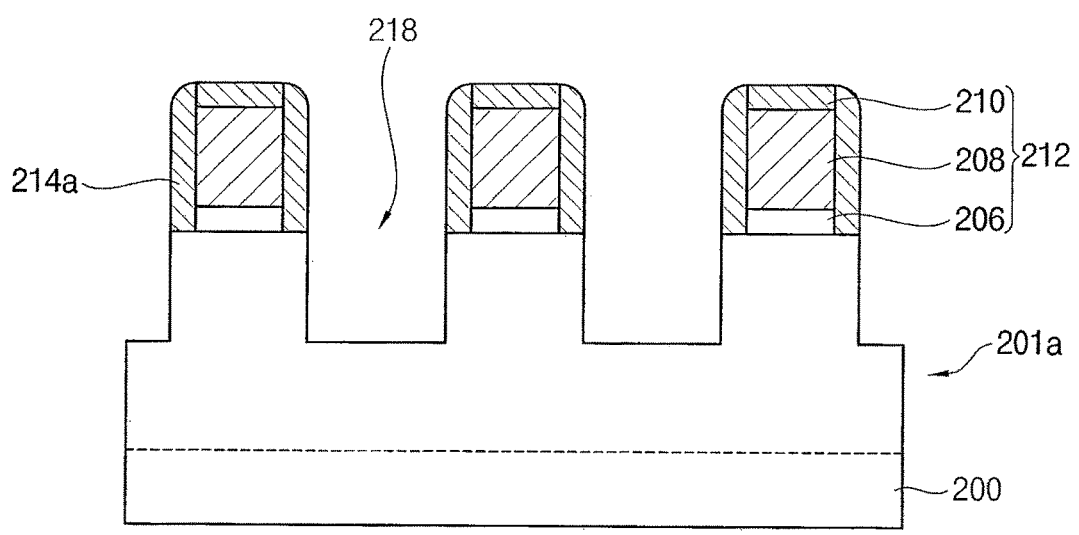
Figure 19:
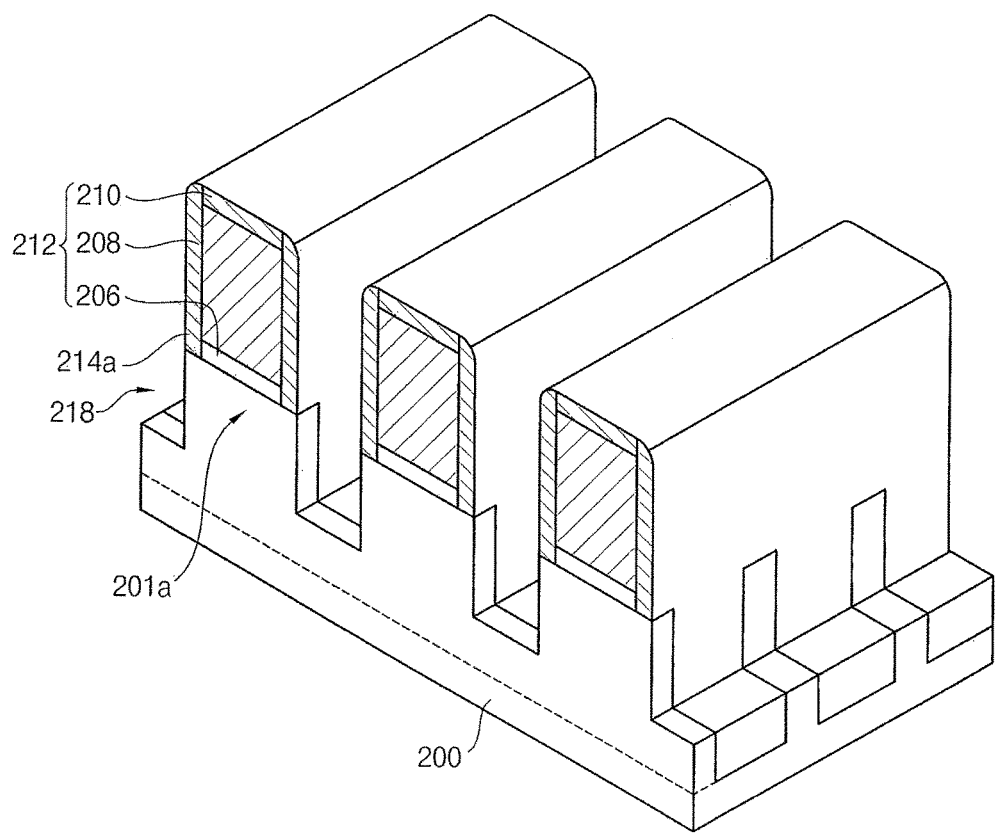

FIGS. 14 to 22 are cross-sectional views illustrating stages of a method of manufacturing a semiconductor device in accordance with an example embodiment. FIGS. 14-16, 18, and 20-22 are cross-sectional views taken along line I-I' of FIG. 13, and FIGS. 17 and 19 are perspective views of FIGS. 16 and 18, respectively.

Figure 14:
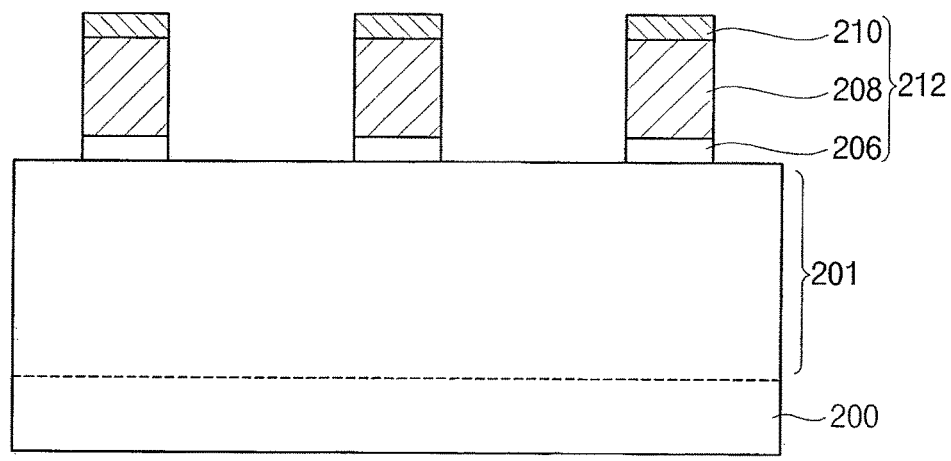
FIGS. 14 to 22 illustrate cross-sectional views and perspective views of stages of a method of manufacturing a semiconductor device in accordance with an example embodiment.

Referring to FIG. 14, an upper portion of the substrate 200 may be partially removed to form a trench extending in the first direction, and an isolation layer may be formed on the substrate 200 to fill a lower portion of the trench. A plurality of dummy gate structures 212 may be formed on the substrate 200 and the isolation layer. Before forming the trench, impurities may be implanted into the substrate 200 to form a well region.

As the isolation layer is formed, a preliminary active fin 201 may be formed on the substrate 200 to extend in the first direction. In example embodiments, a plurality of preliminary active fins 201 may be arranged in a second direction substantially perpendicular to the first direction.

The dummy gate structures 212 may be formed by sequentially stacking a dummy insulation layer, a dummy gate electrode layer, and a hard mask layer on the preliminary active fin 201 and the isolation layer, patterning the hard mask layer by a photolithography process using a photoresist pattern to form a first hard mask 210, and sequentially etching the dummy gate electrode layer and the dummy insulation layer using the first hard mask 210 as an etching mask. Thus, each of the dummy gate structures 212 may be formed to include a dummy insulation layer 206, a dummy gate electrode 208, and the first hard mask 210 sequentially stacked. The dummy gate structure 212 may have a stacked structure substantially the same as a stacked structure of the dummy gate structure 112 illustrated with reference to FIG. 2.

In example embodiments, each of the dummy gate structures 212 may be formed to extend in the second direction on the preliminary active fin 201 and the isolation layer, and the plurality of dummy gate structures 212 may be formed at a given distance from each other in the first direction.

Referring to FIG. 15, a preliminary spacer layer may be conformally formed on the dummy gate structures 212, the preliminary active fin 201, and the isolation layer. The preliminary spacer layer may include silicon nitride.

At least one of boron molecular ions and carbon molecular ions may be implanted into the preliminary spacer layer to form a spacer layer 214 including silicon nitride doped with boron molecular ions and/or carbon molecular ions. After performing the molecular ion implantation, an annealing process may be preformed on the spacer layer 214.

In example embodiments, before forming the preliminary spacer layer, an offset spacer layer may be further formed on the dummy gate structure 212, the preliminary active fin 201, and the isolation layer. The offset spacer layer may be formed of, e.g., silicon oxide. The offset spacer layer may be formed by a CVD process, an ALD process, or a thermal oxidation process.

The preliminary spacer layer may be formed by performing processes substantially the same as or similar to processes illustrated with reference to FIG. 3. Also, the molecular ion implantation process may be substantially the same as or similar to processes illustrated with reference to FIG. 4.

Thus, the spacer layer 214 may be formed to have a dielectric constant lower than a dielectric constant of a spacer layer including only silicon nitride. The spacer layer 214 may be formed of different materials according to the molecular ion. That is, the spacer layer 214 may include one of silicon carbonitride (SiCN), silicon boron nitride (SiBN), and silicon boron carbonitride (SiBCN).

Referring to FIGS. 16 and 17, the spacer layer 214 may be anisotropically etched to form the spacer 214a on sidewalls of each of the dummy gate structures 212. In some example embodiments, the dummy gate structure 212 may serve as a gate electrode structure. In this case, impurity regions may be formed at upper portions of the substrate 200 adjacent to the dummy gate structure 212, so that a FinFET may be manufactured. That is, subsequent processes as described below may not be performed.

Referring to FIGS. 18 and 19, the preliminary active fin 201 may be partially removed using the dummy gate structures 212 and the spacer 214a as an etch mask to form the active fin 201a including the recess 218. In example embodiments, the etching processes for forming the spacers 214a and the recess 218 may be performed in-situ.

Figure 20:
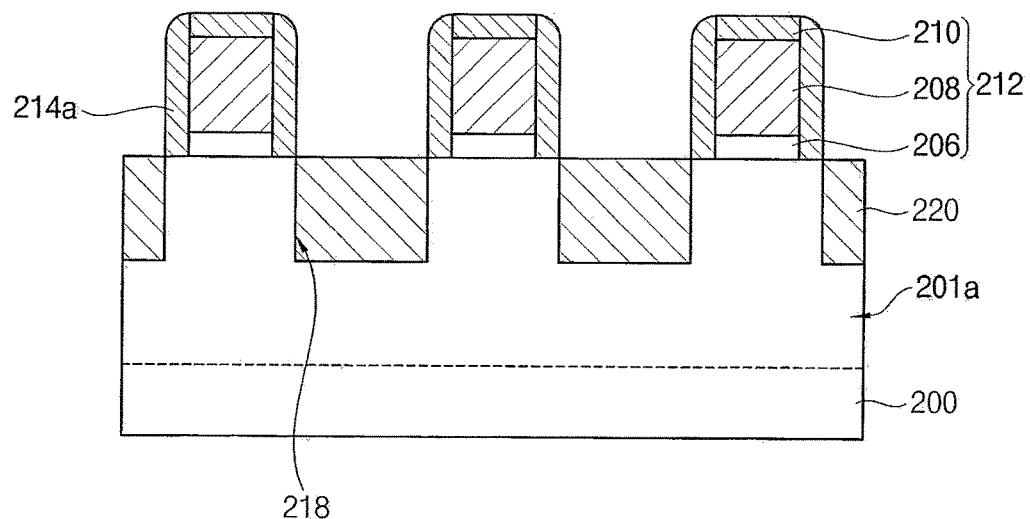

Referring to FIG. 20, the epitaxial pattern 220 may be formed to fill the recess 218. In example embodiments, a plurality of epitaxial patterns 220 may be formed in the second direction. Sidewalls of the epitaxial patterns 220 in the second direction may contact with each other to be merged into a single layer.

For example, a selective epitaxial growth (SEG) process may be performed using a surface portion of the active fin 201a exposed by the recess 218 as a seed to form the epitaxial patterns 220. The epitaxial patterns 220 may be grown not only in a vertical direction but also in a horizontal direction, and thus each of the epitaxial patterns 220 may be formed to have a cross-section of, e.g., pentagon, hexagon, or rhombus. In example embodiments, the plurality of epitaxial patterns 220 formed in the second direction may be grown to be merged into a single layer, and thus the plurality of epitaxial patterns 220 may contact each other.

In example embodiments, when the SEG process is performed, impurities may be doped in-situ into the epitaxial patterns 220. Thus, the epitaxial pattern 220 may serve as source/drain regions of the FinFET.

In example embodiments, the epitaxial pattern 220 may be formed of silicon or silicon-germanium.

In example embodiments, after performing the SEG process, impurities may be further implanted into the active fin 201a, and the substrate 200 may be annealed.

Figure 21:
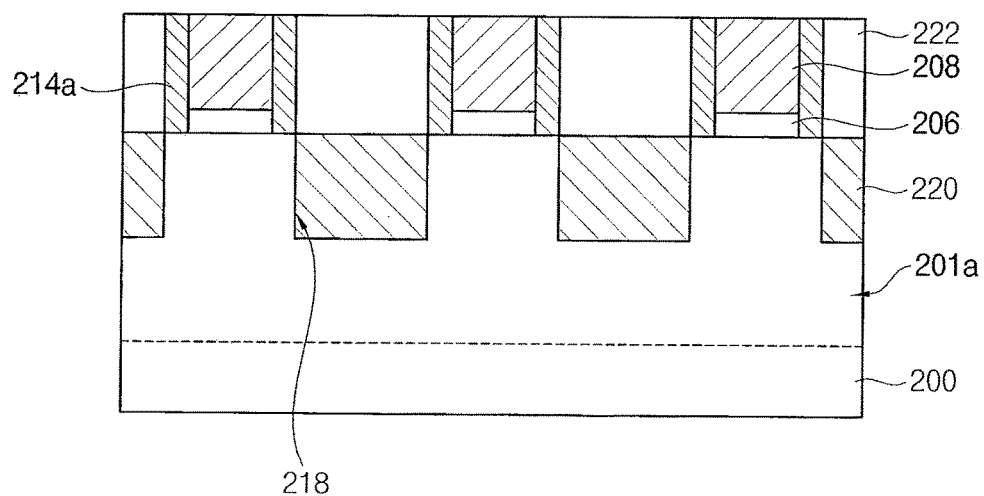

Referring to FIG. 21, the first insulating interlayer 222 covering the dummy gate structures 212, the spacer 214a, the epitaxial pattern 220, and the isolation layer may be formed on the substrate 200, and an upper portion of the first insulating interlayer 222 may be planarized until top surfaces of the dummy gate structures 212 is exposed. In example embodiments, the planarization process may be performed by a CMP process and/or an etch back process.

In example embodiments, the first hard mask 210 may be removed by the planarization process. In some example embodiments, the first hard mask 210 may partially remain on the dummy gate electrode 208.

Figure 22:
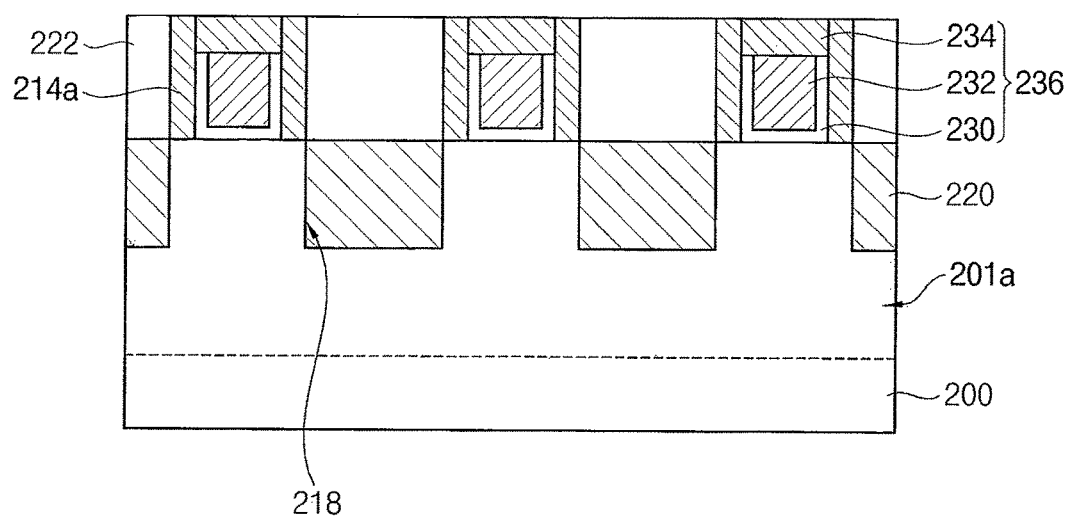

Referring to FIG. 22, the dummy gate structure 212 may be replaced with a gate structure 236. In detail, the dummy gate electrode 208 and the dummy gate insulation pattern 206 may be isotropically etched to form an opening. The isotropic etching process may include a wet etching process. A gate structure 236 may be formed to fill each of the openings. The gate structure 236 may include the gate insulation layer 230, the gate electrode 232, and the hard mask 234 sequentially stacked. The gate structure 236 may be formed by performing processes substantially the same as the processes illustrated with reference to FIG. 8.

A second insulating interlayer may be formed to cover the gate structure 236 on the first insulating interlayer 222. A wiring structure may be formed through the first insulating interlayer 222 and the second insulating interlayer to be connected with the source/drain regions of the epitaxial pattern 220. Thus, the FinFET of FIG. 13 may be manufactured.

Figure 23:
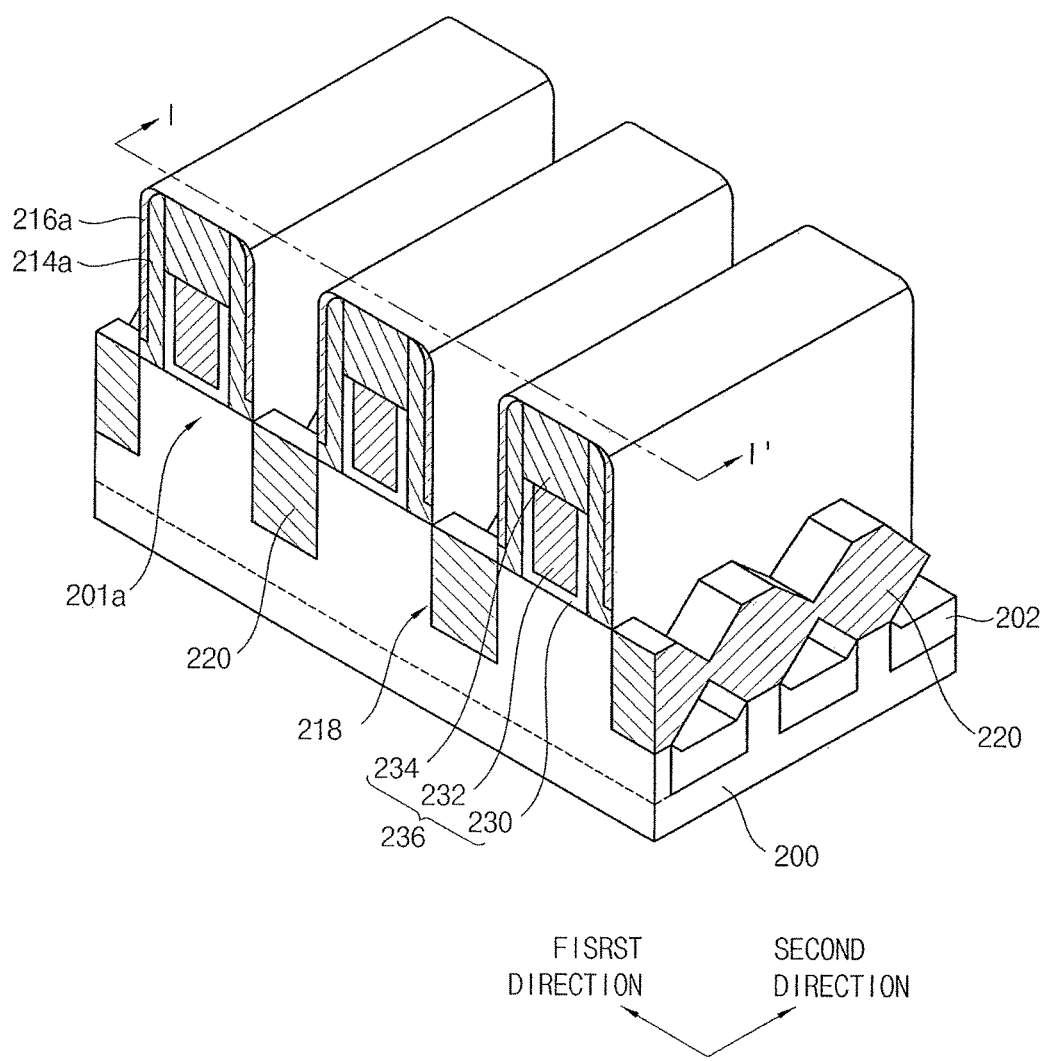
FIG. 23 illustrates a perspective view of a semiconductor device in accordance with an example embodiment.

FIG. 23 is a perspective view illustrating a semiconductor device in accordance with example embodiment. The semiconductor device may be substantially the same as or similar to the semiconductor device of FIG. 13, except for spacers.

Referring to FIG. 23, a spacer structure including the first spacer 214a and a second spacer 216a may be formed on sidewalls of the gate structure 236. The first spacer 214a may be substantially the same as the spacer illustrated with reference to FIG. 13. That is, the first spacer 214a may include silicon nitride doped with at least one of boron molecular ions and carbon molecular ions. In example embodiments, the first spacer 214a may have a dielectric constant lower than a dielectric constant of a spacer including only silicon nitride.

The second spacer 216a may be formed on the first spacer 214a. The second spacer 216a may have a thickness less than a thickness of the first spacer 214a. The second spacer 216a may have an etch rate lower than an etch rate of the first spacer 214a during an etching process for silicon oxide. That is, the second spacer 216a may have an etching selectivity with respect to silicon oxide higher than an etching selectivity of the first spacer 214a with respect to silicon oxide. Also, the second spacer 216a may have an etch rate lower than an etch rate of the first spacer during an etching process for silicon. In example embodiments, the second spacer 216a may include silicon nitride.

Figure 24:
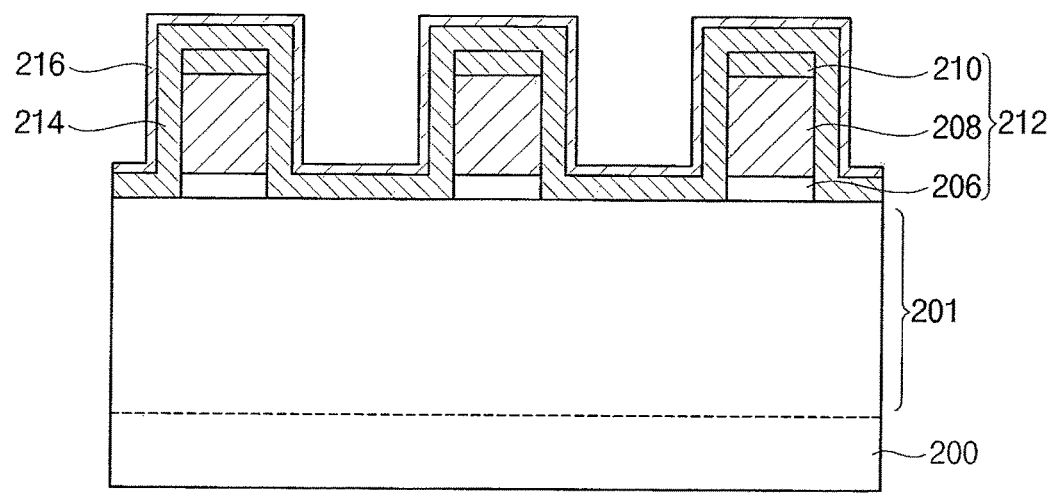
FIG. 24 illustrates a cross-sectional view of stages of a method of manufacturing a semiconductor device in accordance with an example embodiment.

FIG. 24 is a cross-sectional view illustrating stages of a method of manufacturing a semiconductor device in accordance with example embodiment.

First, processes substantially the same as or similar to processes illustrated with reference to FIGS. 14 to 15 may be performed. Thus, the first spacer layer 214 may be formed on a sidewall of the dummy gate structure 212 and the substrate 200. The first spacer layer 214 may include silicon nitride doped with at least one of boron molecular ions and carbon molecular ions.

Referring to FIG. 24, a second spacer layer 216 may be formed on the first spacer layer 214. The second spacer layer 216 may be formed to have a thickness less than a thickness of the first spacer layer 214. In example embodiments, the second spacer layer 216 may be formed by a CVD process or an ALD process. The second spacer layer 216 may have an etch rate lower than an etch rate of the first spacer layer 214 during an etching process for silicon oxide. That is, the second spacer layer 216 may have a higher etch selectivity with respect to silicon oxide than an etching selectivity of the first spacer layer 214 with respect to silicon oxide. In example embodiments, the second spacer layer 216 may be formed of, e.g., silicon nitride.

The first and second spacer layers 214 and 216 may be anisotropically etched to form a spacer structure on the sidewalls of the dummy gate structure 212. The spacer structure may include the first spacer 214a (refer to FIG. 23) and the second spacer 216a (refer to FIG. 23).

Also, processes substantially the same as or similar to processes illustrated with reference to FIGS. 18 to 22 may be performed to form a semiconductor device of FIG. 23.

The second spacer 216a may have a lower etch rate than the etch rate of the first spacer 214a during etching the substrate 200 for forming the recess 218. Thus, damages of the first and second spacers 214a and 216a may decrease in the etching process for forming the recess 218.

As described above, the semiconductor device may include a MOS transistor including spacers on the sidewalls of the gate structure. The semiconductor device may include a memory device, a logic device, etc.

By way of summation and review, as semiconductor device integration is increased, a distance between adjacent gate structures may decrease. As such, parasitic capacitance between adjacent gate structures may increase.

In contrast, according to example embodiments, a spacer on the sidewalls of the gate structure may include a material having a dielectric constant lower than a dielectric constant of silicon nitride. That is, molecular ions, e.g., boron molecules or carbon molecules, may be implanted into a silicon nitride layer to form silicon carbonitride (SiCN) or silicon boron nitride (SiBN) having a dielectric constant lower than a dielectric constant of the silicon nitride. Thus, parasitic capacitance between adjacent gate structures may decrease, and the semiconductor device including the gate structure with the spacers may have a high reliability. Further, in the implantation of the molecular ions (rather than atomic ions), a doping depth of the molecular ions may be shallow, and thus impurities may be selectively implanted only into the preliminary spacer layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a first gate structure on a substrate, the first gate structure including a gate insulation layer, a gate electrode, and a hard mask sequentially stacked on the substrate;
    forming a preliminary spacer layer on sidewalls of the first gate structure and the substrate, the preliminary spacer layer including silicon nitride;
    implanting molecular ions into the preliminary spacer layer to form a spacer layer having a dielectric constant lower than a dielectric constant of the preliminary spacer layer;
    after implanting the molecular ions, anisotropically etching the spacer layer to form spacers on the sidewalls of the first gate structure; and
    doping impurities into the substrate adjacent the spacers to form impurity regions at upper portions of the substrate adjacent to the first gate structure,
    wherein the molecular ions include a compound of carbon and hydrogen or a compound of boron and hydrogen.

2. The method as claimed in claim 1, wherein each of the molecular ions has a mass of about 20 AMU to about 1000 AMU, and a dose of the molecular ions is about $5E13/cm^2$ to about $1E16/cm^2$.

3. The method as claimed in claim 1, further comprising, after implanting the molecular ions, annealing the spacer layer.

4. The method as claimed in claim 1, wherein a doping depth of the molecular ions is less than or substantially equal to a thickness of the preliminary spacer layer.

5. The method as claimed in claim 1, further comprising forming an upper spacer on each spacer.

6. The method as claimed in claim 1, further comprising, after anisotropically etching the spacer layer to form the spacers on the sidewalls of the first gate structure:
    forming an insulating interlayer on the substrate along outer sidewalls of the spacers;
    removing the first gate structure to form an opening; and
    forming a second gate structure to fill the opening, the second gate structure including a gate insulation layer, a gate electrode, and a hard mask, the gate electrode including a metal, the gate insulation layer covering sidewalls and a bottom of the gate electrode, and the hard mask being on the gate electrode and the gate insulation layer.

7. The method as claimed in claim 1, wherein the preliminary spacer layer is formed by an atomic layer deposition (ALD) process or a chemical vapor deposition (CVD) process.

8. A method of manufacturing a semiconductor device, the method comprising:
    forming a dummy gate structure on a substrate;
    forming a preliminary spacer layer on sidewalls of the dummy gate structure and the substrate, the preliminary spacer layer including silicon nitride;
    implanting molecular ions into the preliminary spacer layer to a doping depth less than or substantially equal to a thickness of the preliminary spacer layer to form a spacer layer having a dielectric constant lower than a dielectric constant of the preliminary spacer layer;
    anisotropically etching the spacer layer to form spacers on the sidewalls of the dummy gate structure;

etching an upper portion of the substrate adjacent to the spacer layer to form a recess;

forming an epitaxial pattern including impurities in the recess; and replacing the dummy gate structure with a gate structure including a gate insulation layer, a gate electrode, and a hard mask sequentially stacked, the gate electrode including a metal.

9. The method as claimed in claim 8, wherein the molecular ions include a compound of carbon and hydrogen or a compound of boron and hydrogen.

10. The method as claimed in claim 8, further comprising, after implanting the molecular ions, annealing the spacer layer.

11. The method as claimed in claim 8, wherein the preliminary spacer layer has a thickness of about 10 Å to about 500 Å.

12. The method as claimed in claim 8, further comprising forming an upper spacer on each spacer.

13. The method as claimed in claim 8, wherein replacing the dummy gate structure with the gate structure includes:

forming an insulating interlayer on the substrate to fill spaces between adjacent spacers;

removing the dummy gate structure to form an opening; and forming the gate structure to fill the opening.

14. The method as claimed in claim 8, further comprising, before forming the dummy gate structure, etching upper portions of the substrate to form an active fin protruding from a surface of the substrate.

15. A method of manufacturing a semiconductor device, the method comprising:

forming a first gate structure on a substrate, the first gate structure including a gate insulation layer, a gate electrode, and a hard mask sequentially stacked on the substrate;

conformally forming a preliminary spacer layer on sidewalls of the first gate structure and the substrate, the preliminary spacer layer including silicon nitride and having a predetermined thickness;

implanting molecular ions into the preliminary spacer layer to a depth equal to or smaller than the predetermined thickness of the preliminary spacer layer, such that a spacer layer having a dielectric constant lower than a dielectric constant of the preliminary spacer layer is formed;

anisotropically etching the spacer layer to form spacers on the sidewalls of the first gate structure; and forming impurity regions at upper portions of the substrate adjacent to the first gate structure.

16. The method as claimed in claim 15, wherein implanting the molecular ions includes forming a spacer layer including silicon carbonitride or silicon boron nitride.

17. The method as claimed in claim 15, wherein implanting the molecular ions includes selectively implanting the molecular ions only between top and bottom surfaces of the preliminary spacer layer.

18. The method as claimed in claim 15, wherein forming the preliminary spacer layer to have the predetermined thickness includes forming the preliminary spacer layer to a thickness of about of about 10 Å to about 500 Å.

19. The method as claimed in claim 15, wherein implanting the molecular ions is performed with an energy of about 0.1 KeV to about 50 KeV, each of the molecular ions having a mass of about 20 AMU to about 1000 AMU, and a dose of the molecular ions being about $5E13/cm^2$ to about $1E16/cm^2$.

* * * * *